(12) United States Patent
Roy et al.

(10) Patent No.: US 9,024,240 B2
(45) Date of Patent: May 5, 2015

(54) COMPACT IMAGE SENSOR ARRANGEMENT WITH READ CIRCUITRY OVER PIXEL ZONES

(75) Inventors: François Roy, Seyssins (FR); Frédéric Barbier, Grenoble (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 644 days.

(21) Appl. No.: 13/014,255

(22) Filed: Jan. 26, 2011

(65) Prior Publication Data

US 2011/0180689 A1 Jul. 28, 2011

(30) Foreign Application Priority Data

Jan. 28, 2010 (FR) .................................. 10 50572

(51) Int. Cl.
| | | |
|---|---|---|
| *H01L 27/00* | (2006.01) | |
| *H01L 27/146* | (2006.01) | |
| *H01L 21/768* | (2006.01) | |
| *H01L 21/762* | (2006.01) | |

(52) U.S. Cl.
CPC ..... *H01L 27/14603* (2013.01); *H01L 21/76816* (2013.01); *H01L 21/76232* (2013.01); *H01L 21/76229* (2013.01); *H01L 21/762* (2013.01); *H01L 27/14609* (2013.01); *H01L 27/1464* (2013.01); *H01L 27/14641* (2013.01)

(58) Field of Classification Search
CPC ................... H01L 21/76229; H01L 21/76816; H01L 21/762; H01L 21/76232
USPC ................... 250/208.1, 208.2, 214.1, 214 R; 257/431, 444, 447, 452, 460, 461
See application file for complete search history.

(56) References Cited

U.S. PATENT DOCUMENTS

| | | | |
|---|---|---|---|
| 6,310,366 B1 | 10/2001 | Rhodes et al. | |
| 6,657,665 B1* | 12/2003 | Guidash | 348/308 |
| 2005/0064620 A1* | 3/2005 | Han | 438/57 |
| 2006/0220069 A1* | 10/2006 | Cole et al. | 257/233 |
| 2006/0273241 A1* | 12/2006 | Guidash et al. | 250/208.1 |
| 2007/0087463 A1* | 4/2007 | Adkisson et al. | 438/48 |
| 2007/0091190 A1 | 4/2007 | Iwabuchi et al. | |
| 2007/0194356 A1* | 8/2007 | Moon et al. | 257/291 |
| 2008/0303930 A1* | 12/2008 | Kuroda et al. | 348/308 |
| 2009/0200624 A1 | 8/2009 | Dai et al. | |
| 2009/0302406 A1* | 12/2009 | Gambino et al. | 257/432 |
| 2010/0193845 A1 | 8/2010 | Roy et al. | |

OTHER PUBLICATIONS

French Search Report dated Aug. 19, 2010 from corresponding French Application No. 10/50572.
Coudrainp, et al., *Investigation of a Sequential Three-Dimensional Process for Back-Illuminated CMOS Image Sensors With Miniaturized Pixels*, IEEE Transactions on Electron Devices IEEE USA, vol. 56, No. 11, Nov. 30, 2009, pp. 2403-2413, XP002596625.

* cited by examiner

*Primary Examiner* — Francis M Legasse, Jr.
(74) *Attorney, Agent, or Firm* — Seed IP Law Group PLLC

(57) ABSTRACT

An image sensor having a number of pixel zones delimited by isolation trenches, each pixel zone including a photodiode; a transfer gate associated with each of the pixel zones and arranged to transfer charge from the photodiode to a sensing node; and a read circuit for reading a voltage at one of the sensing nodes, the read circuitry including a number of transistors of which at least one is positioned at least partially over a pixel zone of the pixel zones.

32 Claims, 6 Drawing Sheets

COMPACT IMAGE SENSOR ARRANGEMENT WITH READ CIRCUITRY OVER PIXEL ZONES

CROSS REFERENCE TO RELATED APPLICATIONS

This application claims the priority benefit of French patent application number 10/50572, filed on Jan. 28, 2010 entitled "Compact Image Sensor Arrangement," which is hereby incorporated by reference to the maximum extent allowable by law.

BACKGROUND OF THE INVENTION

1. Field of the Invention

The present invention relates to an image sensor and a method of forming an image sensor, and in particular to an image sensor comprising an array of pixels.

2. Discussion of the Related Art

Monolithic image sensors comprise photodiodes and transistors formed in a silicon substrate. More specifically, such image sensors comprise an array of pixels each having a pinned photodiode coupled to a sensing node by a transfer transistor. A charge accumulated by the photodiode during an integration period can be transferred to the sensing node via the transfer transistor.

Reading the voltage stored at the sensing node is performed using read circuitry, generally comprising a source follower transistor, having its gate coupled to the sensing node. Furthermore, a reset transistor is also provided coupled to the sensing node, allowing the voltage of the sensing node to be reset after each read. To reduce the number of components, the read circuitry is often shared by more than one photodiode.

The sensitivity of the image sensor is, to some extent, determined by the active surface area within which photons may be captured and converted into electrical charge. Thus to increase the sensitivity of the image sensor, one option would be to increase the size of the active surface area of each pixel. However, there is a problem in doing so without increasing the overall size of the image sensor.

SUMMARY OF THE INVENTION

Embodiments of the present disclosure aim to at least partially address one or more problems in the prior art.

According to one aspect, there is provided an image sensor comprising a plurality of pixel zones delimited by isolation trenches, each pixel zone comprising a photodiode; a transfer gate associated with each of said pixel zones and arranged to transfer charge from said photodiode to a sensing node; and a read circuit for reading a voltage at one of the sensing nodes, the read circuitry comprising a plurality of transistors at least one of which is positioned at least partially over a pixel zone of said plurality of pixel zones, wherein the isolation trenches delimiting the pixel zones are deep trench isolations, and the at least one transistor for example has a channel region bounded on at least one side by a shallow trench isolation.

According to another aspect, there is provided an image sensor comprising: a plurality of pixel zones delimited by isolation trenches, each pixel zone comprising a photodiode; a transfer gate associated with each of said pixel zones and arranged to transfer charge from said photodiode to a sensing node; and a read circuit for reading a voltage at one of the sensing nodes, the read circuitry comprising a plurality of transistors at least one of which is positioned at least partially over a pixel zone of said plurality of pixel zones, wherein said at least one transistor comprises: a source follower transistor formed at least partially over a first of said pixel zones and having a control node coupled to said sensing node and one of its main current nodes coupled to a column line; and a reset transistor formed at least partially over a second pixel zone adjacent to the first pixel zone, said reset transistor being coupled between said sensing node and a reset voltage level.

According to yet a further aspect, there is provided an image sensor comprising: a plurality of pixel zones delimited by isolation trenches, each pixel zone comprising a photodiode; a transfer gate associated with each of said pixel zones and arranged to transfer charge from said photodiode to a sensing node; and a read circuit for reading a voltage at one of the sensing nodes, the read circuitry comprising a plurality of transistors at least one of which is positioned at least partially over a pixel zone of said plurality of pixel zones, wherein the transfer gate comprises a column formed in an opening in the isolation trench delimiting each pixel zone, wherein a sensing node is also formed in said opening, adjacent to said column.

According to one embodiment, the at least one transistor is a MOS transistor having a source and drain formed in said pixel zone, and a gate stack at least partially overlying said pixel zone.

According to another embodiment, the at least one transistor is formed within a doped well formed in said pixel zone.

According to another embodiment, the pixel zones are formed in a silicon wafer, and wherein the at least one transistor formed at least partially over a pixel zone is formed on a first side of said silicon wafer, and wherein said image sensor is arranged to be illuminated from a second side of said silicon substrate opposite to said first side.

According to another embodiment, the read circuit comprises a sensing node coupled to the photodiodes of the pair of pixel zones, wherein one of said pair of pixel zones has said source follower transistor formed at least partially over it, and the other of said pair of pixel zones has said reset transistor formed at least partially over it.

According to another embodiment, the at least one transistor additionally comprises: a read transistor formed at least partially over a third pixel zone adjacent to the first or second pixel zones, said read transistor being coupled between said source follower transistor and a column line.

According to another embodiment, the read circuit comprises a sensing node coupled to four of said pixel zones, wherein a first of said four pixel zones has said source follower transistor formed at least partially over it, a second of said four pixel zones has said reset transistor formed at least partially over it, a third of said four pixel zones has said read transistor formed at least partially over it, and a fourth of said four pixel zones has a second one of said source follower transistors formed over it.

According to another embodiment, the transfer gate comprises a gate stack formed over an edge of the photodiode.

According to another embodiment, at least one of the pixel zones comprises a reflective plate arranged to reflect the light not absorbed by said pixel zone.

According to another aspect, there is provided an electronic device comprising the above image sensor.

According to yet another aspect, there is provided a method of manufacturing an image sensor, such as any of the above image sensors, the method comprising: forming, in a silicon wafer, isolation trenches delimiting a plurality of pixel zones; forming a photodiode in each pixel zone; forming a transfer gate associated with each of said pixel zones and arranged to transfer charge from said photodiode to a sensing node; and forming at least one transistor at least partially over a pixel zone of said plurality of pixel zones, said at least one transistor forming read circuitry for reading a voltage at one of the sensing nodes.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the figures, like features have been labelled with like reference numerals.

DETAILED DESCRIPTION

Figure 1:
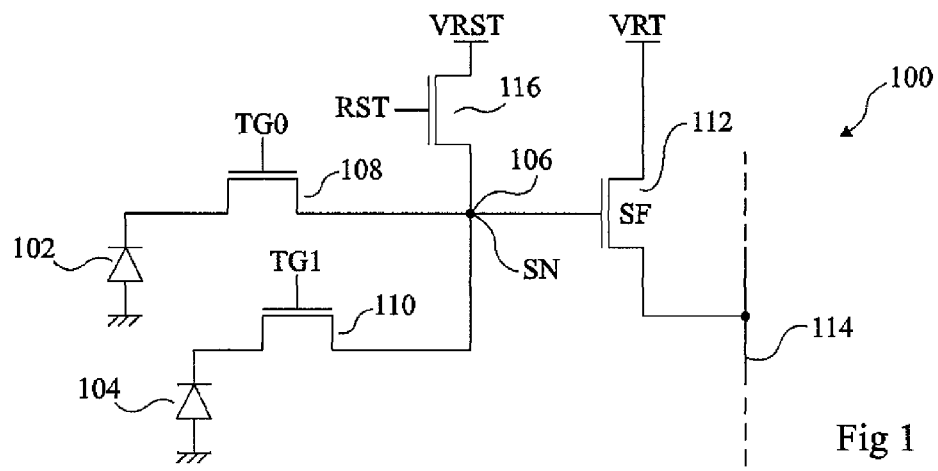
FIGS. 1 and 2 illustrate schematically examples of pixel circuitry of an image sensor.
Figure 2:
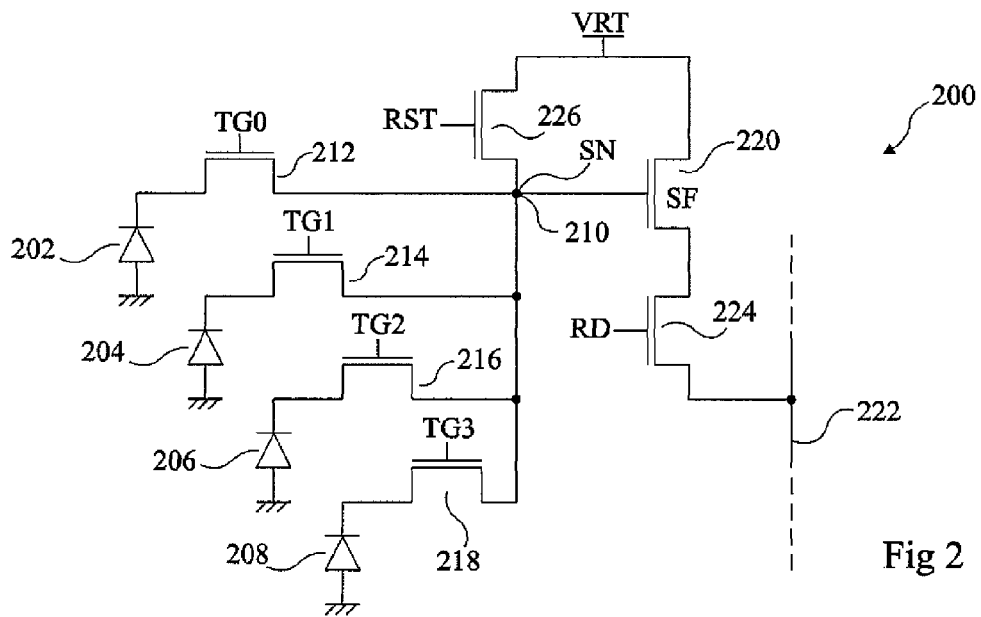

FIGS. 1 and 2 illustrate examples of 2T and 1T75 pixel circuits respectively.

Pixel circuit 100 of FIG. 1 comprises two pinned photodiodes 102 and 104, each coupled to a sensing node (SN) 106 via a respective transfer transistor 108, 110. Transistors 108 and 110 are for example MOS transistors receiving, at their respective gates, transfer voltages TG0 and TG1. The sensing node 106 is further coupled to read circuitry. In particular the sensing node is coupled to the gate of a source follower transistor 112, which has its drain coupled to a supply voltage VRT, and its source to coupled to a column line 114, and to a reset voltage VRST via a reset transistor 116, which receives a reset signal RST at its gate.

The pixel circuitry 200 of FIG. 2 comprises four pinned photodiodes 202, 204, 206 and 208, each of which is coupled to a sensing node (SN) 210 via a respective transfer transistor 212, 214, 216 and 218. The transfer transistors 212 to 218 are, for example, MOS transistors, and receive, at their respective gates, transfer voltages TG0 to TG3. The sensing node 210 is coupled to read circuitry. In particular, the sensing node is coupled to the gate of a source follower transistor 220, which has its drain coupled to the supply voltage VRT, and its source coupled to a column line 222 via a read transistor 224. The read transistor 224 receives at its gate a read signal RD. The sensing node 210 is also coupled to the supply voltage VRT via a reset transistor 226, which receives at its gate a reset voltage RST.

Both the pixel circuits 100 and 200 operate by accumulating charges on the photodiodes during an integration phase, and subsequently transferring, in turn, the charges accumulated in each of the photodiodes to the sensing node before output on the column line via the source follower transistor, and in the case of circuit 200, the read transistor.

Figure 3:
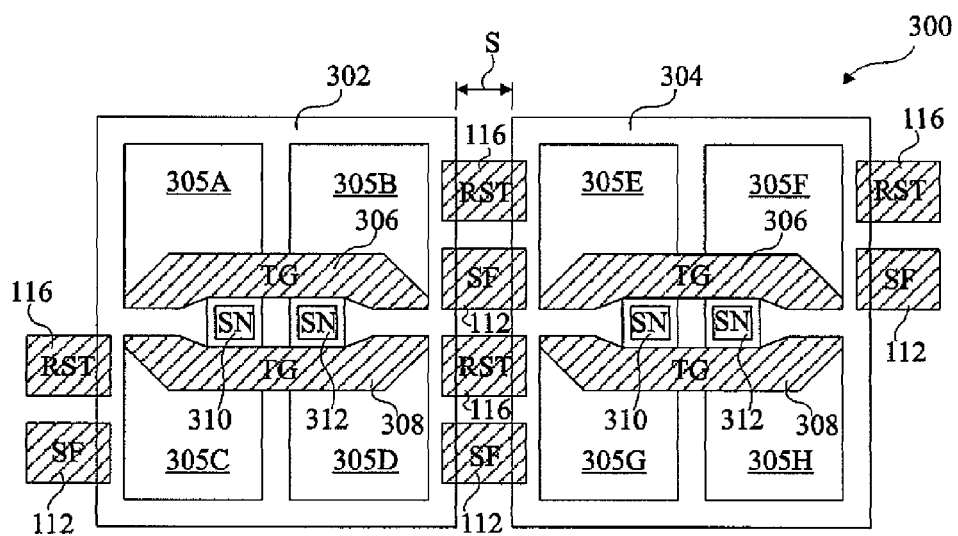
FIG. 3 illustrates, in plan view, part of an image sensor according to one example.

FIG. 3 illustrates, in plan view, a portion 300 of an image sensor implementing four of the pixel circuits 100 of FIG. 1. Isolation trenches form grids 302 and 304, each delimiting four pixel zones arranged two by two, grid 302 delimiting zones 305A to 305D, and grid 304 delimiting zones 305E to 305H. Each of these pixel zones comprises an underlying photodiode (not shown in FIG. 3), which stores the charges accumulated during the integration period. A pair of transfer gates 306 and 308 is arranged over each grid 302, 304, each extending over a corresponding pair of the pixel zones and allowing charges to be transferred, at the same time, from the pair of pixel zones to corresponding sensing nodes 310 and 312.

A source follower transistor 112 and a reset transistor 116 are associated with each sensing node 310, 312, of each grid 302, 304, positioned on either side of the grids 302, 304. A separation S between the grids 302, 304 provides space for these transistors to be formed between the isolation trenches. A similar structure to that of FIG. 3 could be used to implement the pixel circuit of FIG. 2, in which one sensing node, source follower transistor, reset transistor and read transistor is provided for each block of four pixel zones.

It would be desirable to enlarge the pixel zones delimited by each of the grids 302 and 304, without increasing the overall size of the image sensor and/or to reduce the overall size of the image sensor without reducing the size of the pixel zones.

Figure 4A:
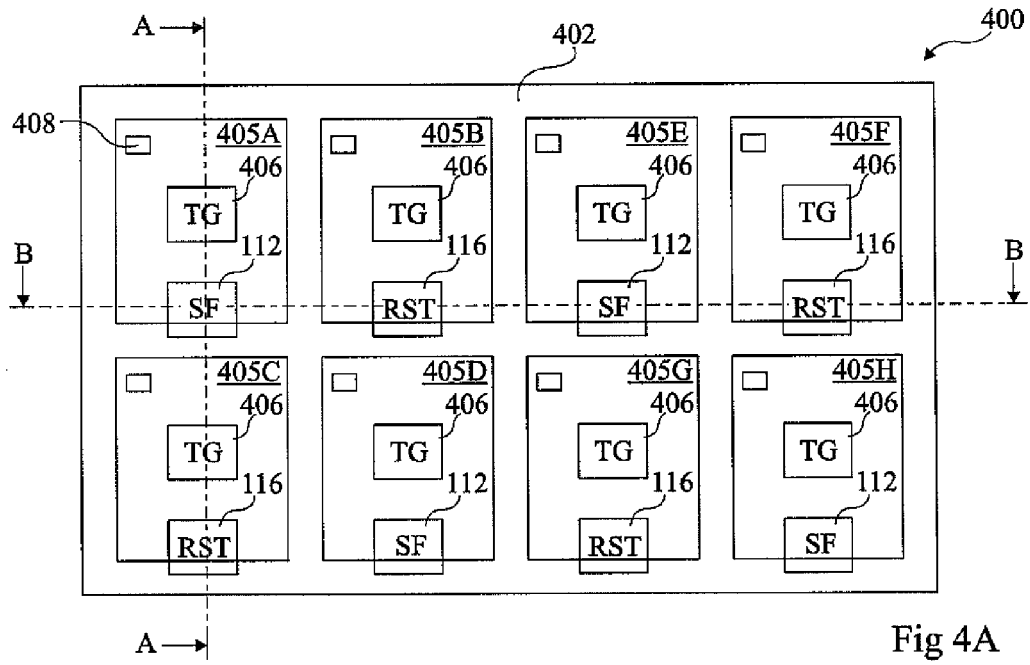
FIG. 4A illustrates, in plan view, part of an image sensor according to an embodiment of the present invention.

FIG. 4A illustrates, in plan view, a portion 400 of an image sensor also implementing the pixel circuit 100 of FIG. 1. Isolation trenches form a grid 402 delimiting, in this example, a total of eight pixel zones 405A to 405H. These pixel zones, for example, correspond respectively to the pixel zones 305A to 305H delimited by grids 302 and 304 in FIG. 3, but grid 402 is continuous, with no separation S. Thus, each of the pixel zones of the portion 400 may be larger than those of FIG. 3, and/or the overall image sensor may be more compact.

As with the embodiment of FIG. 3, each pixel zone 405A to 405H comprises an underlying photodiode (not shown in FIG. 3). In the embodiment of FIG. 4A, in addition to a transfer gate 406, a further transistor is also formed in each pixel zone, and in particular the further transistor has a gate electrode at least partially overlying each pixel zone 405A to 405H. In the case of pixel zones 405A, 405D, 405E and 405H, the further transistor is the source follower transistor 112 of the pixel circuit of FIG. 1, and in the case of pixel zones 405B, 405C, 405F and 405G, the further transistor is the reset transistor 116 of the pixel circuit of FIG. 1. While not illustrated in FIG. 4A, each of the further transistors 112, 116 is for example a MOS transistor having sources and drains formed within the silicon of the pixel regions 405A to 405H. Each pixel zone 405A to 405H further comprises a bulk contact 408, which serves as a contact for both the transfer transistor and the source follower transistor.

Figure 4B:
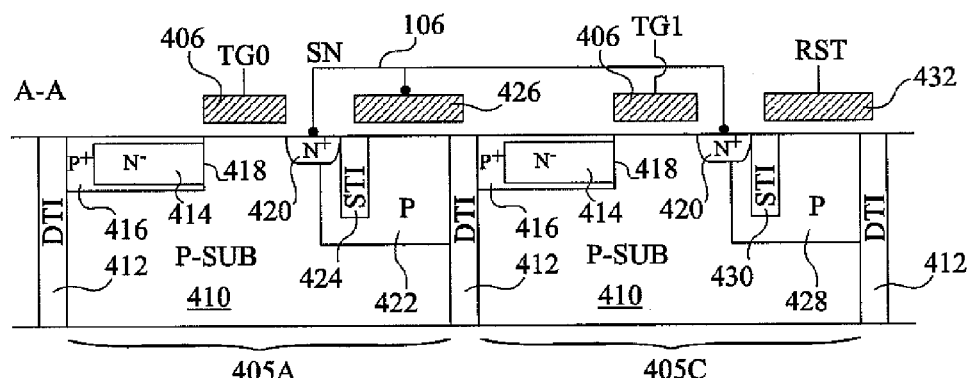
FIGS. 4B and 4C are cross-section views of the image sensor of FIG. 4A.

FIG. 4B is a cross-section view taken along a line A-A of FIG. 4A passing through two adjacent pixel zones 405A, 405C. In particular, the cross-section traverses the transfer gates 406 of the pixel zones 405A, 405C, the source follower transistor 112 of pixel zone 405A and the reset transistor 116 of pixel zone 405C.

The structure in cross section comprises a P-type substrate (P-SUB) 410, divided by isolation trenches 412 of the grid 402. In this example, the isolation trenches 412 are deep trench isolations (DTI), although in alternative embodiments shallow trench isolations (STI) could be used.

The photodiode of each pixel zone 405A, 405C is formed of a lightly doped N-type (N⁻) region 414, surrounded by a heavily doped P-type (P⁺) region 416 on all sides except one side 418 via which charges may be transferred. Transfer gate 406 is stacked over the pixel zone 405A between the exposed side 418 of the photodiode and a sensing node 420 formed of a heavily doped N-type (N+) region.

The source follower transistor 112 of pixel region 405A is formed in a heavily doped P-type well 422, which, in this example, contacts the sensing node 420. On one side of transistor 112, a shallow trench isolation (STI) 424 is formed, extending, for example, across the pixel zone between the deep trench isolations. In this example, the source follower transistor 112 thus has a channel region isolated by the STI 424 on one side, and on the other side the DTI trench 412 that separates the pixel zones 405A and 405C.

The source follower transistor 112 has a gate stack comprising a gate electrode 426 formed over the region bounded by the STI 424 and DTI 412. As with the other transistors shown in cross section herein, for simplicity only a gate electrode of the gate stack is represented, and not the gate insulation, spacers etc. As illustrated schematically in FIG. 4B, the gate electrode 426 is coupled to the sensing node 420, which in this example is common between the pixel zones 405A and 405C.

The reset transistor 116 is formed in a similar fashion in the pixel zone 405C, within a P-type well 428. Transistor 116 has a channel region bounded on one side by an STI 430 and on the other side by the DTI delimiting pixel zone 405C, and has a gate electrode 432.

Figure 4C:
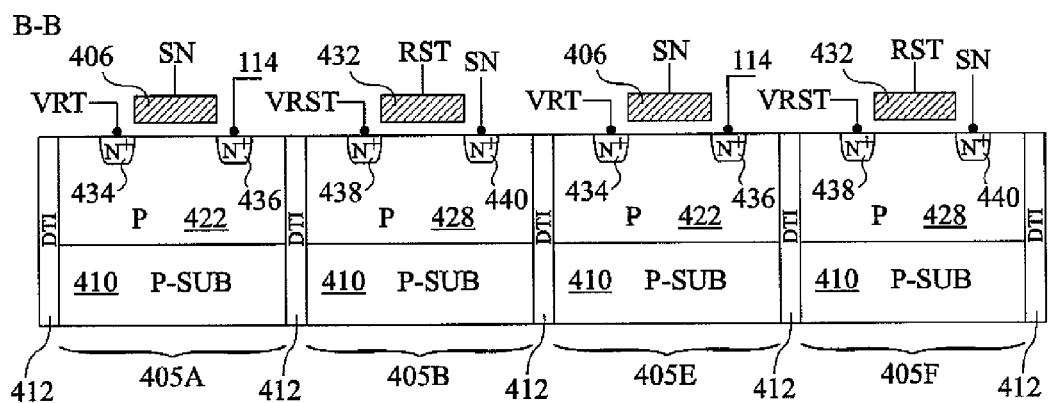

FIG. 4C is a cross-section view taken along a line B-B of FIG. 4C, which passes, in a direction perpendicular to the cross-section A-A, through the source follower transistors 112 and reset transistors 116 of the row of four pixel zones 405A, 405B, 405E and 405F.

The P-type wells 422 in this example extend across the width of the pixel zones. Within the P-type wells 422 on either side of the gate electrode 406, a source 434 and a drain 436 are formed of heavily doped N-type regions. The drain 434 is coupled to the supply voltage VRT, and the source 436 is coupled to the column line 114.

Similarly, the reset transistors 116 of pixel zones 405B and 405F are formed in the P-type wells 428, which again extend across the width of the pixel zones. In the P-type wells 428, on either side of the gate electrode 432, a source 438 and a drain 440 are formed of heavily doped N-type regions. The drain and source 438, 440 are coupled to the reset voltage VRST and sensing node, respectively.

The P-type substrate 410 and deep trench isolations are for example of the same depth, each of between 1 and 10 μm. The DTI 412 is, for example, between 0.1 and 0.4 μm in width, and the pixel zones are, for example, in the region of 1 to 10 μm square. The STI 424, 430 is for example between 0.1 and 0.4 μm in width, and between 2 and 1 μm in depth, for example corresponding to between 2 and 10 percent of the depth of the DTI 412.

The image sensor of FIG. 4A is arranged to be backside illuminated. In particular, the source follower and reset transistors are formed on the front side, while light enters the P-type substrate 410 from the opposite side, referred to herein as the backside. This is advantageous, as the formation of transistors on the front side therefore does not inhibit the entry of light into the pixel zones. A further advantage is that, by forming the isolations between the source follower/reset transistors and the rest of the pixel zones using shallow trench isolations 424, 430, the region of the P-type substrate 410 under these transistors still receives photons that will be converted into charges stored in the photodiode, and thus these regions contributes to the active pixel area of the device.

Figure 5A:
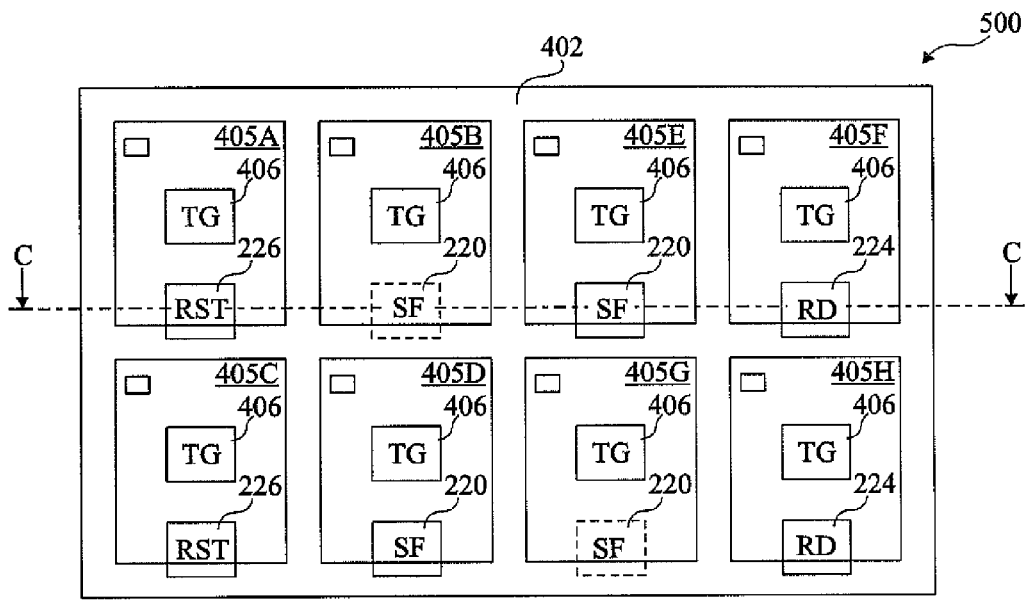
FIG. 5A illustrates, in plan view, part of an image sensor according to a further embodiment of the present invention.

FIG. 5A illustrates a portion 500 of an image sensor implementing the pixel circuit 200 of FIG. 2. Many features, such as the grid 402, pixel zones 405A to 405H, and the transfer gates 406, are the same as those of FIG. 4A, and will not be described again in detail. Rather than each pixel zone 405A to 405H comprising either a source follower transistor 112 or a reset transistor 116, in FIG. 5A, the pixel zones are grouped in blocks of four, three of which comprise a source follower, read and reset transistor 220, 224, 226 respectively, and the fourth of which for example comprises only the transfer gate.

Alternatively, this fourth pixel region could comprise a second source follower transistor, as illustrated by a dashed box in FIG. 5A. By using two source follower transistors coupled in parallel, this would double the effective width of the source follower transistor, leading to a reduced noise spectral density and increased dynamic range of the image sensor.

Figure 5B:
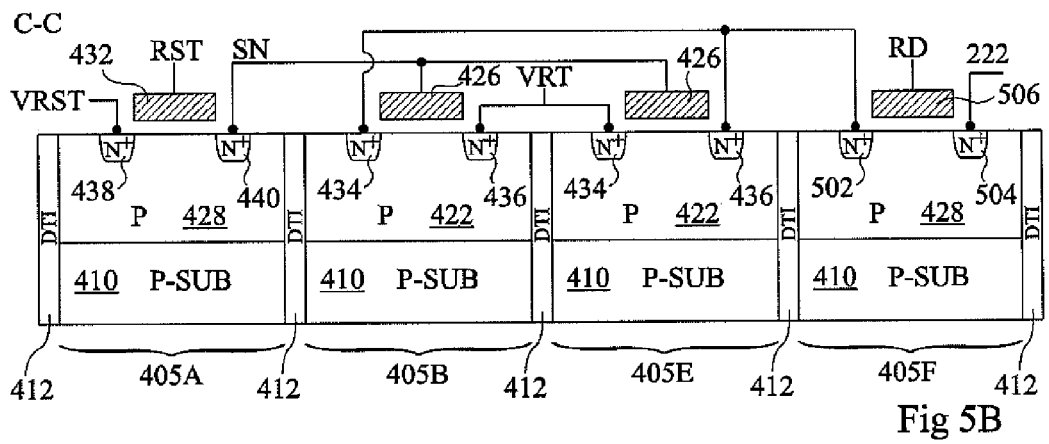
FIG. 5B is a cross-section view of the image sensor of FIG. 5A.

FIG. 5B is a cross section view corresponding to a line C-C of FIG. 5A, passing through the row of pixel zones 405A, 405B, 405E and 405F, and in particular passing through the reset, source follower and read transistors of zones 405A, 405E and 405F, and a second source follower transistor positioned in pixel zone 405B.

The source follower and reset transistors in FIG. 5B have the same structure as those shown in FIG. 4C, and will not be described again in detail. The read transistor 224 is similar to the source follower and reset transistors, but comprises, within the heavily doped P-type well 428, a drain 502 coupled to the sources 434 of both the source follower transistors, a source 504 coupled to the column line 222, and a gate stack comprising a electrode 506 coupled to the read signal RD for controlling when a read is to occur.

Figure 6:
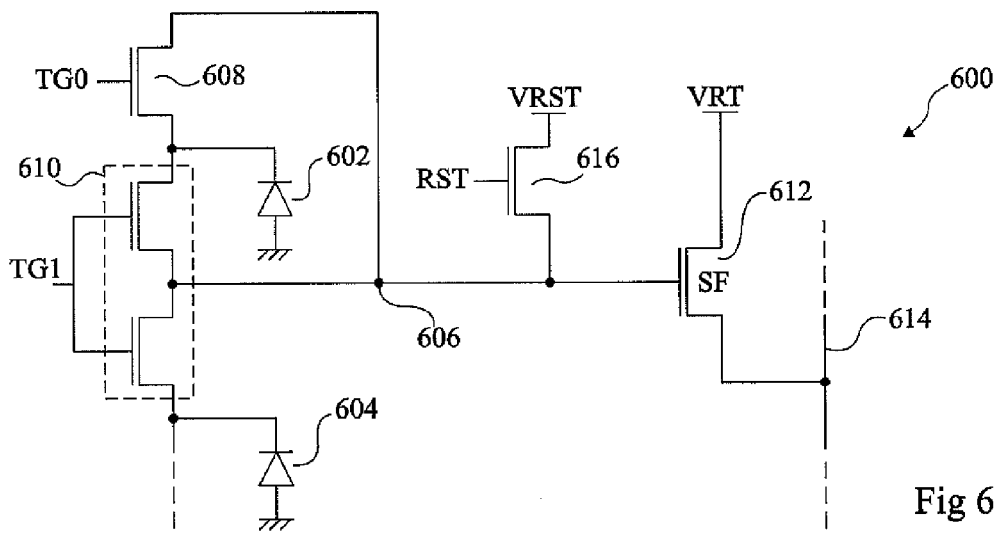
FIG. 6 illustrates schematically pixel circuitry according to an alternative example.

FIG. 6 illustrates schematically an example of an alternative pixel circuit 600 in which the transfer transistors are formed vertically between adjacent pixel zones, rather than over each pixel zone, and thus each transfer transistor may access two pixel zones. Such a circuit is for example described in co-pending U.S. patent application with Ser. No. 12/910,176, in the name of the present applicant, the contents of which is hereby incorporated by reference to the maximum extent allowable by the law.

The circuit 600 comprises a pair of pinned photodiodes 602, 604. Photodiode 602 is coupled to a sensing node 606 via a transfer transistor 608, which receives at its gate a first transfer voltage TG0, and via a transfer transistor 610, which also couples photodiode 604 to the sensing node 606. Photodiode 604 is also coupled to the sensing node of further pixel circuit, not shown in FIG. 6, by a further transfer transistor, also not shown in FIG. 6. A source follower transistor 612 has its gate coupled to the sensing node 606, and its source coupled to a column line 614. A reset transistor 616 is coupled between the sensing node 606 and a reset voltage VRST.

In operation, at the end of the accumulation phase, the transfer transistor 608 is first activated to transfer the charge of photodiode 602 to the sensing node 606, and the voltage at node 606 is read via the source follower transistor 612. Then, the charge accumulated by photodiode 604 is transferred to sensing node 606 by activating transfer transistor 610. Transistor 610 is also coupled to photodiode 602, but as the charge from this photodiode has already been transferred, only the charge from photodiode 604 will be transferred when transistor 610 is activated. The voltage at node 606 is then again read via the source follower transistor 612. This transfer and read sequence continues for other the pixel circuits (not shown in FIG. 6).

Figures 7A, 9A:
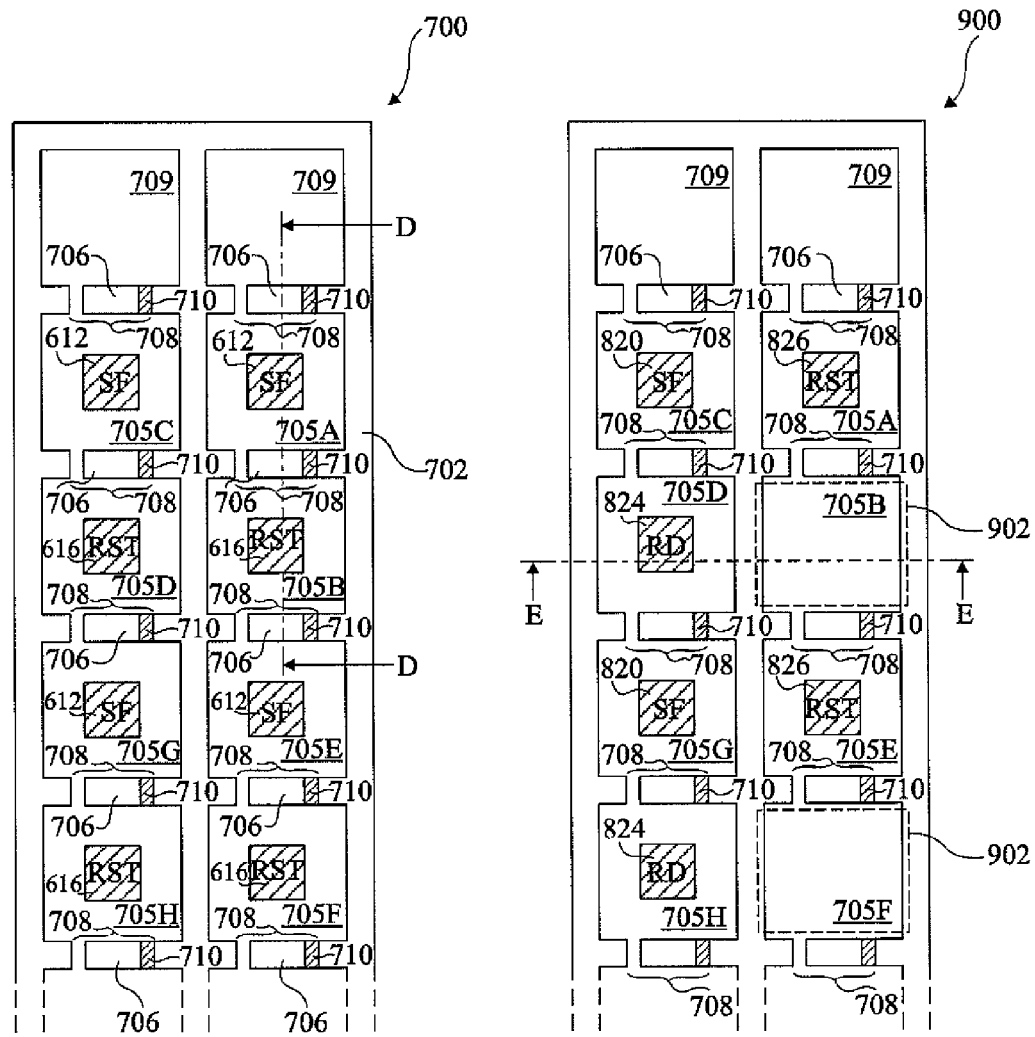
FIG. 7A illustrates, in plan view, part of an image sensor according to a further embodiment of the present invention.
FIG. 9A illustrates, in plan view, part of an image sensor according to a further embodiment of the present invention.

FIG. 7A illustrates, in plan view, a portion 700 of an image sensor implementing, in each column, the pixel circuit 600 of FIG. 6. Isolation trenches form a grid 702, delimiting pixel zones 705A to 705H, in two columns of four rows. Each pixel zone 705A to 705H comprises a photodiode (not shown in FIG. 7A). Transfer gates 706 are formed vertically in openings 708 between adjacent pixel zones in the same row. A first pixel zone 705A, 705C of each column delimited by isolation trenches 702 comprises a masked pixel 709, an opening 708 communicating between the region 709 and zone 705A and having a vertical transfer gate formed therein, which implements the transistor 608 of FIG. 6. Within the openings 708, on one side of each vertical transfer gate 706, a sensing node 710 is formed to which charges may be transferred from the adjacent pixel zones.

Within each pixel zone 705A to 705H, one of a source follower transistor 612 and a reset transistor 616 of the pixel circuitry 600 of FIG. 6 is formed. In the example of FIG. 7A, these transistors 612, 616 are formed in the center of each pixel zone, although in alternative embodiments the transistors could be formed off-center and may overlap the isolation trenches on one or more sides. Pairs of the pixel zones 705A to 705H share common source follower and reset transistors 612, 616. For example, in FIG. 7A, pixel zones 705A and 705B share the source follower and reset transistors 612, 616 respectively formed over them, and the sensing nodes 710 in the openings 708 on either side of pixel zone 705A are each coupled to the gate of the source follower transistor, while the reset transistor is coupled between these sensing nodes 710 and the reset voltage VRST (not shown in FIG. 7A).

Figure 7B:
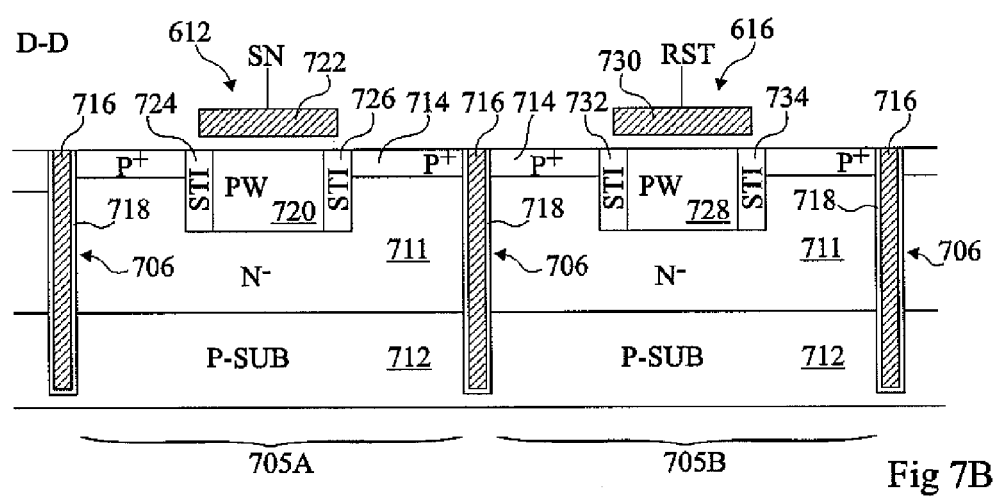
FIG. 7B is a cross-section view of the image sensor of FIG. 7A.

FIG. 7B is a cross-section view taken along a line D-D of FIG. 7A, passing through the vertical transfer gates 706 of two adjacent pixel zones 705A, 705B of one row, and through the source follower and reset transistors 612, 616 of each pixel zone 705A, 705B.

A lightly doped N-type layer 711 is sandwiched between an underlying P-type substrate 712 and an overlying heavily doped P-type layer 714. The vertical transfer gates 716 on each side of the pixels 705A, 705B each comprises a conductive core 716 forming a gate electrode surrounded by an insulating layer 718, insulating the conductive core 716 from the surrounding N-type and P-type silicon. In the example of FIG. 7B, the isolation trenches and transfer gates all extend into the P-type substrate 712, although in alternatively embodiments these features could extend only to the bottom of the N⁻ layer 711.

For example, the DTIs 716 and vertical transfer gates 706 each have a depth of between 1 and 10 μm, and a width of between 0.1 and 0.4 μm. The conducting cores 716 are for example formed of doped polysilicon, and the insulating layers 718 are, for example, formed of silicon oxide, silicon nitride, silicon oxynitride, or a multi-layer structure comprising any combination of these materials, and have a thickness of between 1 and 15 nm. The pixel zones 705A to 705H are, for example, each between 0.8 and 10 μm square, and the openings 708 are for example between 10 and 100 percent of the width of the pixel zones.

In operation, during an integration period, charges are accumulated in the N⁻ layer 711 of each pixel zone, and a low voltage, for example between −1 and 0 V, is applied to the conductive core 716 of each vertical transfer gate to prevent transfer of charges between adjacent pixel zones. During a subsequent transfer and read phase, a voltage of for example between 1 and 3 V is applied to the conductive core 716 of each of the transfer gates in turn to transfer the charge from a corresponding pixel zone. The read order is chosen to start by emptying the pixel zones 705A and 705C using the transfer gate of this zone. Then when a transfer voltage is applied to the transfer gate between the pixel zones 705A and 705B, only the charge from the pixel zone 705B is transferred, and the transfer continues in this fashion.

The source follower transistor 612 in pixel zone 705A is formed in a P-type well 720, for example formed of heavily doped P-type silicon, and comprises a gate stack comprising a gate electrode 722 formed over the P-type well 720. The P-type well 720 is bounded on either side by shallow trench isolations 724, 726. Similarly, the reset transistor 616 is formed within a P-type well 728 for example formed of heavily doped P-type silicon, and comprises a gate stack comprising a gate electrode 730 formed over the P-type well 728. The P-type well 728 is bounded on either side by shallow trench isolations 732, 734 respectively.

Figure 8:
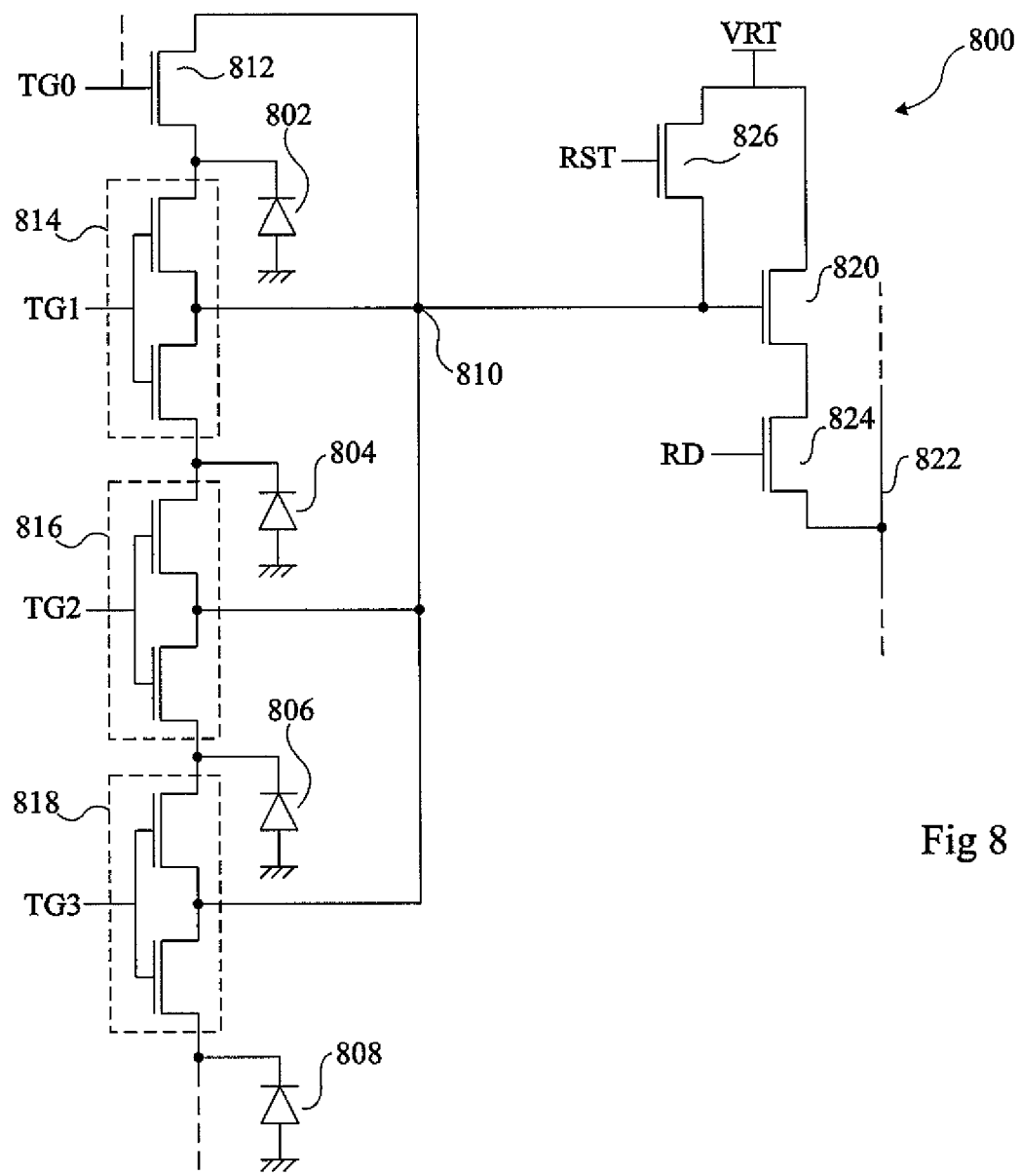
FIG. 8 illustrates schematically pixel circuitry according to yet a further example.

FIG. 8 illustrates schematically a pixel circuit 800, which is similar to the pixel circuit 600 of FIG. 6 and also uses vertical transfer gates between pixel zones, but in which four pixel zones are coupled to a common sensing node, and in which a read transistor is additionally provided. A similar circuit is also for example described in co-pending U.S. patent application with Ser. No. 12/910,176.

The pixel circuit 800 comprises four photodiodes 802, 804, 806 and 808. Photodiode 802 is coupled to a sensing node 810 via vertical transfer gates 812 and 814, photodiode 804 is coupled to the sensing node 810 via the vertical transfer gates 814 and 816, photodiode 806 is coupled to the sensing node 810 via vertical transfer gates 816 and 818, and photodiode 808 is coupled to the sensing node 810 via vertical transfer gate 818. The vertical transfer gates 812, 814, 816 and 818 are controlled by control voltages TG0, TG1, TG2 and TG3 respectively. The sensing node 810 is also coupled to the gate of a source follower transistor 820, the source of which is coupled to a column line 822 via a read transistor 824 receiving at its gate a read signal RD. The sensing node 810 is also coupled to a supply voltage VRT via a reset transistor 826 controlled at its gate by a reset signal RST.

FIG. 9A illustrates, in plan view, a portion 900 of an image sensor implementing the pixel circuit of FIG. 8. The layout is similar to that of FIG. 7A, and like features have been labelled with like reference numerals and will not be described again in detail. Whereas in FIG. 7A, pairs of pixel zones comprise a source follower transistor 612 and a reset transistor 616, in the embodiment of FIG. 9A, each group of four pixel zones comprises a source follower transistor 820, a read transistor 824 and a reset transistor 826. These transistors are positioned in each pixel zone in a similar fashion to those of FIG. 7A. The fourth pixel zone, for example, has no transistor. For example, pixel zones 705A, 705C and 705D in FIG. 9A comprise the reset transistor 826, source follower transistor 820 and read transistor 824 respectively, whereas the pixel zone 705B comprises no transistor. This space could be used for a second source follower transistor for each pixel circuit, as in the embodiment of FIG. 5A described above. Alternatively, as represented by dashed boxes 902 in FIG. 9A, protective covers could be positioned over these pixel zones, for reflecting light received via the back side that has not been absorbed within the depth of silicon traversed. For example, this can be the case for red light.

Figure 9B:
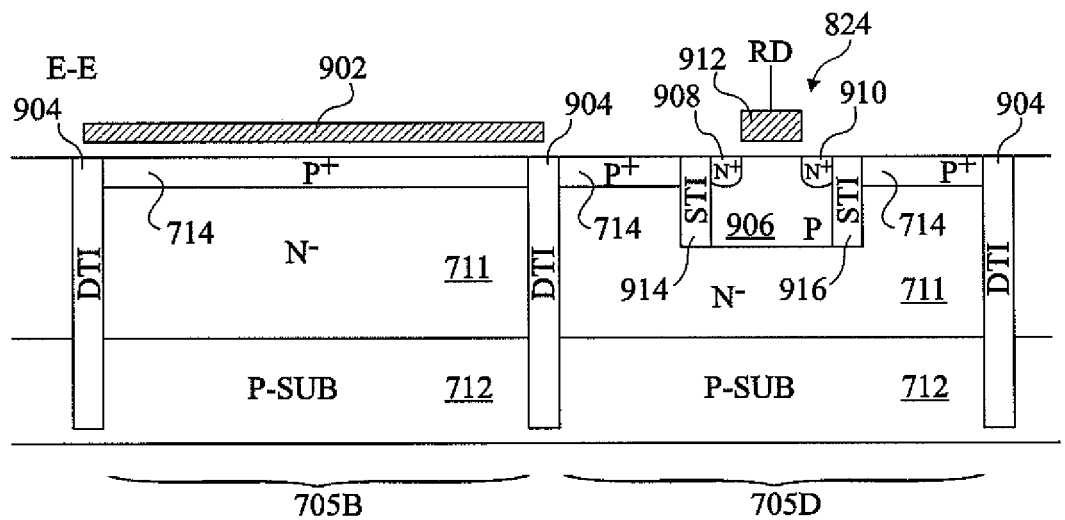
FIG. 9B is a cross-section view of the image sensor of FIG. 9A.

FIG. 9B is a cross-section view corresponding to a line E-E passing through the image sensor of FIG. 9A, and in particular passing through pixel zone 705B having a protective cover 902 formed over it, and pixel zone 705D in which a read transistor is formed.

As with the structure shown in FIG. 7B, the image sensor pixel zones comprise a lightly doped N-type layer 711 sandwiched between an underlying P-type substrate 712 and an overlying heavily doped P-type layer 714. The pixel zones are bounded by deep trench isolations 904, for example by forming a MOS capacitance: of doped silicon oxide/polycrystalline silicon. Over the pixel zone 705B, the protective layer 902 is for example of a metal such as aluminium, copper, tungsten, titanium or tantalum. The protective plate 902 is for example formed at the same level as the gate electrodes of the read, source follower and reset transistors, and in some embodiments can be formed during the same metal deposition step.

In pixel zone 705D, the read transistor 824 is formed in a doped P-type well 906. Source and drain 908, 910 are, for example, formed of heavily doped N-type regions in the P-type well on either side of a channel region over which a gate stack is formed, comprising a gate electrode 912. The P-type well 906 is bounded on either side by shallow trench isolations 914, 916.

During manufacture of an image sensor having the structure of FIG. 4A, 5A, 7A or 9A, the grids of isolation trenches are for example formed in a silicon wafer, and then the photodiode and the wells of the source follower, reset and/or read transistors are formed, prior to forming the gate stacks and sources/drains.

Figure 10:
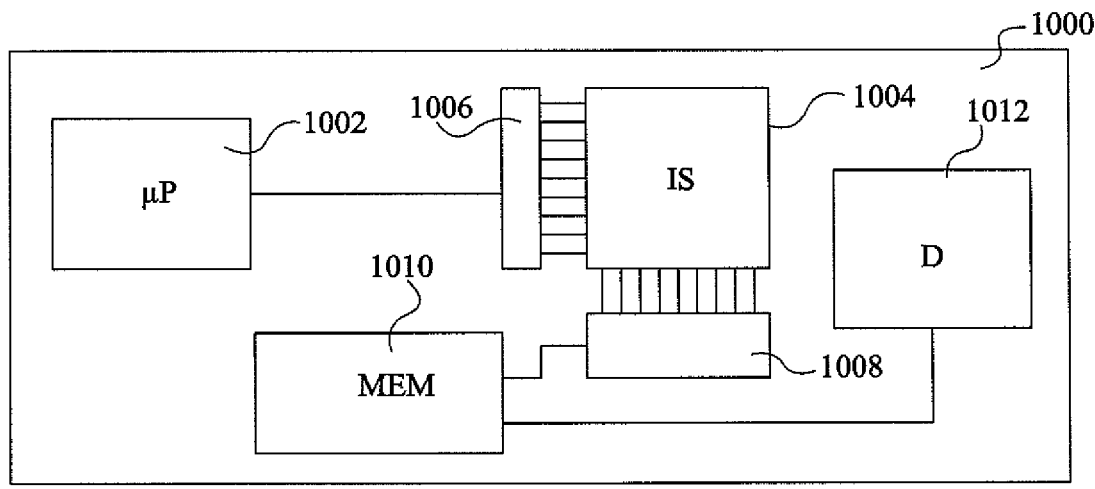
FIG. 10 illustrates schematically an image capturing device according to an embodiment of the present invention.

FIG. 10 illustrates an electronic device 1000, comprising a microprocessor 1002, and an image sensor 1004 for example comprising an array of the pixels as described herein, and associated with a control circuit 1006, which generates the signals RST, TG, and RD in the case of pixel circuits 200 and 800, for controlling the pixel circuits of the image sensor. Read circuitry 1008 is also coupled to the image sensor, for example comprising switches and capacitors for sampling and storing voltage values read from the column read lines of the image sensor 1004. A memory 1010 for example stores images captured by the image sensor, and a display 1012 for example displays captured images.

The electronic device 1000 is, for example, a digital still and/or video camera, mobile device or portable games console having image capturing capabilities, a webcam, laptop computer or other digital image capturing device having an image sensor adapted to capture still images and/or video.

An advantage of the embodiments described herein is that, by forming read circuitry, such as source follower and/or reset transistors of the pixel circuit over the pixel zones, the overall size of the image sensor can be reduced and/or the size of each pixel zone can be increased. In prior art circuits there is a spacing S shown in FIG. 3 of between 0.2 and 1 μm, whereas without this spacing, the pixel zones could be between 5 and 40 percent wider.

While the present invention has been described in relation to a number of specific embodiments, it would be apparent to those skilled in the art that various alterations and modifications could be applied.

For example, it will be apparent to those skilled in the art that different positioning of the source follower and reset transistors over the pixel zones would be possible.

Furthermore, while examples have been described in which the pixel zones are delimited by a grid of non-active DTI, in alternative embodiments, these DTI could be active, in other words comprising an insulated conductive core to which a voltage can be applied to create a surface channel for charge for reducing dark current at the interface. Furthermore, it will be apparent to those skilled in the art that one or more of the DTI described herein could be replaced by an STI. Furthermore, the STI 424, 430, 914 and 916 could be replaced by local oxidization of silicon (LOCOS), junction isolation, etc.

Furthermore, while example of some 2T and 1T75 pixel circuits have been described herein, it will be apparent to those skilled in the art that the invention can be applied to the read circuitry of other pixel circuits having the same or a different number of transistors per photodiode.

While the transistors described throughout are MOS transistors, it will be apparent to those skilled in the art that the invention could be applied to other technologies.

Furthermore, it will be apparent to those skilled in the art that while in the embodiments described herein, at most one transistor of the read circuitry is formed over a given pixel zone, in alternative embodiments, more than one transistor could be formed over a given pixel zone. For example, in the embodiment of FIG. 7A, pixel zone 705A could have both a source follower transistor 612 and a reset transistor 705B formed over it, while the adjacent pixel zone 705B could have no transistor formed over it, and instead a protective plate could be provided, similar to the embodiment of FIG. 9A.

It will be apparent to those skilled in the art that the features described in relation to the various embodiments can be combined in any combination. For example, while in the embodiments of FIG. 4B the photodiodes are positioned laterally with respect to source follower transistor 112 and the reset transistor 116, in alternative embodiments these transistors could be positioned above the photodiodes.

Such alterations, modifications, and improvements are intended to be part of this disclosure, and are intended to be within the spirit and scope of the invention. Accordingly, the foregoing description is by way of example only and is not intended as limiting. The present invention is limited only as defined in the following claims and the equivalents thereto.

What is claimed is:

1. An image sensor comprising:
   a plurality of pixel zones formed in a substrate;
   a plurality of isolation trenches delimiting the pixel zones and separating the pixel zones from each other;
   a plurality of photodiodes respectively positioned in the pixel zones;
   a plurality of sensing nodes associated with the pixel zones;
   a plurality of transfer gates respectively associated with said pixel zones, each transfer gate being arranged to transfer charge from said photodiode of the associated pixel zone to one of the sensing nodes; and
   a read circuit for reading a voltage at the one of the sensing nodes, the read circuit including a plurality of transistors including at least one transistor that is positioned at least partially over a first pixel zone of said plurality of pixel zones, wherein said isolation trenches delimiting said pixel zones are deep trench isolations, wherein said deep trench isolations and said substrate are of equal depth and wherein said at least one transistor has a channel region bounded on at least one side by a shallow trench isolation of less depth than the deep trench isolations, wherein each transfer gate comprises a conductive column formed in an opening in the isolation trench delimiting the pixel zone associated with the transfer gate, wherein the one of the sensing nodes is also formed in said opening, adjacent to said conductive column.

2. The image sensor of claim 1, wherein said at least one transistor is a MOS transistor having a source and drain formed in said first pixel zone, and a gate stack at least partially overlying said first pixel zone.

3. The image sensor of claim 1, wherein said at least one transistor is formed within a doped well formed in said first pixel zone.

4. The image sensor of claim 1, wherein said pixel zones are formed in substrate that comprises a silicon wafer, and wherein said at least one transistor is formed on a first side of said silicon wafer, and wherein said image sensor is arranged to be illuminated from a second side of said silicon substrate opposite to said first side.

5. The image sensor of claim 1, wherein said at least one transistor comprises:
   a first source follower transistor formed at least partially over the first pixel zone and having a control node coupled to said one of the sensing nodes and a main current node coupled to a column line; and
   a reset transistor formed at least partially over a second pixel zone, of the plurality of pixel zones, adjacent to the first pixel zone, said reset transistor being coupled between said one of the sensing nodes and a reset voltage node.

6. The image sensor of claim 1, wherein each transfer gate comprises a gate stack formed over an edge of said photodiode of the associated pixel zone.

7. The image sensor of claim 1, wherein at least one of said pixel zones comprises a protective cover arranged to reflect the light not absorbed by said pixel zone.

8. An electronic device comprising the image sensor of claim 1.

9. The image sensor of claim 5, wherein said one of the sensing nodes is coupled to the photodiodes of the first and second pixel zones.

10. The image sensor of claim 5, wherein said at least one transistor additionally comprises:
    a read transistor formed at least partially over a third pixel zone, of the plurality of pixel zones, adjacent to the first or second pixel zones, said read transistor being coupled between said first source follower transistor and a column line.

11. The image sensor of claim 10, wherein said one of the sensing nodes is coupled to said first, second, and third pixel zones, and a fourth pixel zone of the plurality of pixel zones, wherein the read circuit includes a second source follower transistor formed over the fourth pixel zone.

12. An image sensor comprising:
    a plurality of pixel zones formed in a substrate;
    a plurality of isolation trenches delimiting the pixel zones, wherein the isolation trenches include respective openings within the substrate and between adjacent pixel zones;
    a plurality of photo diodes respectively positioned in the pixel zones, each photodiode including a charge accumulation layer in the substrate;
    a plurality of sensing nodes associated with the pixel zones;
    a plurality of transfer transistors respectively associated with said pixel zones, each transfer transistor being arranged to transfer charge from said photodiode of the associated pixel zone to one of the sensing nodes, wherein each transfer transistor comprises:
       a gate electrode formed vertically in the opening in the isolation trench between the associated pixel zone and an adjacent pixel zone of the plurality of pixel zones and extending at least to a bottom of the charge accumulation layer, and
       an insulating layer positioned in the opening, surrounding the gate electrode, and insulating the gate electrode from an adjacent portion of the substrate, wherein the sensing node is formed in the opening, adjacent to the gate electrode; and
    a read circuit for reading a voltage at one of the sensing nodes, the read circuit including a plurality of transistors at least one of which is positioned at least partially over a pixel zone of said plurality of pixel zones, wherein said at least one transistor comprises:
       a first source follower transistor formed at least partially over a first of said pixel zones and having a control node coupled to said sensing node and one of its main current nodes coupled to a column line; and
       a reset transistor formed at least partially over a second pixel zone, of the plurality of pixel zones, adjacent to the first pixel zone, said reset transistor being coupled between said sensing node associated with the second pixel zone and a reset voltage node.

13. The image sensor of claim 12, wherein said at least one transistor is a MOS transistor having a source and drain formed in said first pixel zone, and a gate stack at least partially overlying said first pixel zone.

14. The image sensor of claim 12, wherein said at least one transistor is formed within a doped well formed in said first pixel zone.

15. The image sensor of 12, wherein said pixel zones are formed in a silicon wafer, and wherein said at least one transistor is formed on a first side of said silicon wafer, and wherein said image sensor is arranged to be illuminated from a second side of said silicon substrate opposite to said first side.

16. The image sensor of claim 12, wherein said at least one transistor additionally comprises:
    a read transistor formed at least partially over a third pixel zone, of the plurality of pixel zones, adjacent to the first or second pixel zones, said read transistor being coupled between said first source follower transistor and a column line.

17. The image sensor of claim 12, wherein each transfer gate comprises a gate stack formed over an edge of said photodiode of the associated pixel zone.

18. The image sensor of claim 12, wherein at least one of said pixel zones comprises a protective cover arranged to reflect the light not absorbed by said pixel zone.

19. An electronic device comprising the image sensor of claim 12.

20. The image sensor of claim 16, wherein said read circuit comprises a sensing node coupled to said first, second, and third pixel zones, and a fourth pixel zone of the plurality of pixel zones, wherein the read circuit includes a second source follower transistor formed over the fourth pixel zone.

21. An image sensor comprising:
    a plurality of pixel zones;
    a plurality of isolation trenches delimiting the pixel zones and separating the pixel zones from each other;
    a plurality of photodiodes respectively positioned in the pixel zones;
    a plurality of sensing nodes associated with the pixel zones;
    a plurality of transfer gates respectively associated with said pixel zones, each transfer gate being arranged to transfer charge from said photodiode of the associated pixel zone to one of the sensing nodes, wherein the isolation trenches include openings between adjacent pixel zones and wherein the photodiode includes a charge accumulation layer; and
    a read circuit for reading a voltage at one of the sensing nodes, the read circuit including a plurality of transistors including at least one transistor that is positioned at least partially over a first pixel zone of said plurality of pixel zones, wherein each transfer gate comprises a gate electrode formed vertically in the opening in one of the isolation trenches delimiting the pixel zone associated with the transfer gate and extending at least to a bottom of the charge accumulation layer, wherein the sensing node associated with the transfer gate is also formed in said opening, adjacent to the transfer gate.

22. A method of manufacturing an image sensor comprising:
forming, in a silicon wafer, isolation trenches delimiting a plurality of pixel zones;
forming a plurality of photodiodes respectively positioned in the pixel zones, wherein the isolation trenches include openings within the wafer and between adjacent pixel zones and wherein each photodiode includes a charge accumulation layer within the wafer;
forming a plurality of sensing nodes associated with the pixel zones;
forming a plurality of transfer transistors respectively associated with said pixel zones, each transfer transistor being arranged to transfer charge from said photodiode of the associated pixel zone to one of the sensing nodes, wherein forming the plurality of transfer transistors includes, for each transfer transistor:
forming a gate electrode vertically in the opening in the isolation trench between the associated pixel zone and an adjacent pixel zone of the plurality of pixel zones and extending at least to a bottom of the charge accumulation layer of the photodiode associated with pixel zone associated with the transfer transistor, and the one of the sensing nodes is formed in the opening, adjacent to the transfer transistor; and
forming an insulating layer positioned in the opening, surrounding the gate electrode, and insulating the gate electrode from an adjacent portion of the substrate; and
forming at least one transistor at least partially over a pixel zone of said plurality of pixel zones, said at least one transistor forming read circuitry for reading a voltage at one of the sensing nodes.

23. An image sensor comprising:
a substrate;
a group of pixel zones formed in the substrate;
a plurality of isolation trenches delimiting the pixel zones and separating the pixel zones from each other, each pixel zone including a photodiode arranged to be illuminated from a back side of the substrate, wherein the isolation trenches include openings within the substrate and between adjacent pixel zones and the photodiode includes a charge accumulation layer within the substrate;
transfer transistors respectively associated with the pixel zones and configured to transfer charge from the respective photodiodes of the pixel zones to a sensing node, wherein each transfer transistor comprises a gate electrode formed vertically in the opening in the isolation trench separating the pixel zone associated with the transfer gate and an adjacent pixel zone of the plurality of pixel zones and extending at least to a bottom of the charge accumulation layer of the photodiode of the pixel zone associated with the transfer gate, and the sensing node is formed in the opening, adjacent to the transfer gate; and a read circuit configured to read a voltage at the sensing node, the read circuit comprising:
a first source follower transistor formed on a front side of the substrate at least partially over a first pixel zone of the group of pixel zones, the first source follower transistor having a control electrode coupled to the sensing node; and
a reset transistor formed on the front side of the substrate at least partially over a second pixel zone of the group of pixel zones, the reset transistor being coupled between the sensing node and a reset voltage node.

24. An image sensor as defined in claim 23, wherein the read circuit further comprises a read transistor formed on the front side of the substrate at least partially over a third pixel zone of the group of pixel zones, the read transistor being coupled between the first source follower transistor and a column line.

25. An image sensor as defined in claim 23, wherein the isolation trenches delimiting the pixel zones are deep trench isolations and wherein the first source follower transistor and/or the reset transistor includes a channel region bounded on at least one side by a shallow trench isolation.

26. An image sensor as defined in claim 24, wherein the read circuit further comprises a second source follower transistor formed on the front side of the substrate at least partially over a fourth pixel zone of the group of pixel zones, the second source follower transistor having a control electrode coupled to the sensing node.

27. An image sensor as defined in claim 24, further comprising a protective cover formed on the front side of the substrate over a fourth pixel zone of the group of pixel zones.

28. A method of manufacturing an image sensor comprising:
forming, in a substrate, isolation trenches delimiting pixel zones of a group of pixel zones and separating the pixel zones from each other;
forming a plurality of photodiodes respectively positioned in the pixel zones and arranged to be illuminated from a back side of the substrate, wherein the isolation trenches include openings within the substrate and between adjacent pixel zones and wherein each photodiode includes a charge accumulation layer;
forming transfer transistors respectively associated with the pixel zones and configured to transfer charge from respective photodiodes to a sensing node, wherein each transfer transistor comprises a gate electrode formed vertically in the opening in the isolation trench between adjacent pixel zones and extending at least to a bottom of the charge accumulation layer, and the sensing node is formed in the opening, adjacent to the transfer gate;
forming a first source follower transistor on a front side of the substrate at least partially over a first pixel zone of the group of pixel zones, the first source follower transistor having a control electrode coupled to the sensing node; and
forming a reset transistor on the front side of the substrate at least partially over a second pixel zone of the group of pixel zones, the reset transistor being coupled between the sensing node and the reset voltage.

29. A method of manufacturing an image sensor as defined in claim 28, further comprising forming a read transistor on the front side of the substrate at least partially over a third pixel zone of the group of pixel zones, the read transistor being coupled between the first source follower transistor and a column line.

30. A method of manufacturing an image sensor as defined in claim 28, wherein the isolation trenches delimiting the pixel zones are deep trench isolations and wherein the first source follower transistor and/or the reset transistor includes a channel region bounded on at least one side by a shallow trench isolation.

31. A method of manufacturing an image sensor as defined in claim 29, further comprising forming a second source follower transistor on the front side of the substrate at least partially over a fourth pixel zone of the group of pixel zones, the second source follower transistor having a control electrode coupled to the sensing node.

32. A method of manufacturing an image sensor as defined in claim 29, further comprising forming a protective cover on the front side of the substrate over a fourth pixel zone of the group of pixel zones.

\* \* \* \* \*